(12) United States Patent
Estes

(10) Patent No.: US 6,664,606 B2
(45) Date of Patent: Dec. 16, 2003

(54) MULTI-LAYER INTEGRATED CIRCUIT STRUCTURE WITH REDUCED MAGNETIC COUPLING

(75) Inventor: John C. Estes, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/128,043

(22) Filed: Apr. 23, 2002

(65) Prior Publication Data

US 2003/0197244 A1 Oct. 23, 2003

(51) Int. Cl.[7] ............................................. H01L 29/00
(52) U.S. Cl. ...................... 257/533; 257/531; 257/532; 257/536; 438/382
(58) Field of Search ................................. 257/531, 532, 257/533, 536; 438/957, 382

(56) References Cited

U.S. PATENT DOCUMENTS 6,255,714 B1 * 7/2001 Kossives et al. ............ 257/528
6,362,012 B1 * 3/2002 Chi et al. ...................... 438/3

\* cited by examiner

Primary Examiner—Nathan J. Flynn
Assistant Examiner—Scott R. Wilson
(74) Attorney, Agent, or Firm—William E. Koch

(57) ABSTRACT

A method of utilizing passive circuit components in an integrated circuit comprising the steps of providing a plurality of integrated capacitive elements and a plurality of integrated inductive elements interconnected to form an electrical circuit wherein each inductive element has a width and creates a circumferential magnetic field. Each integrated inductive element is oriented such that the circumferential magnetic field is parallel to the plane of each adjacent integrated capacitive element and parallel to the width of the integrated inductive element so that the resistance of the electrical circuit is decreased and the quality factor is increased.

9 Claims, 4 Drawing Sheets

US 6,664,606 B2

MULTI-LAYER INTEGRATED CIRCUIT STRUCTURE WITH REDUCED MAGNETIC COUPLING

FIELD OF THE INVENTION

This invention relates to multilayer integrated electronic circuits.

More particularly, the present invention relates to electrical integrated circuits which utilize integrated capacitors and inductors.

BACKGROUND OF THE INVENTION

Integrated circuits utilize a variety of circuit elements to process electrical signals. The circuit elements fall into two categories. One category includes active elements, such as transistors. The second category includes passive elements, such as resistors, capacitors, and inductors. Passive elements play an important role in signal processing circuitry, such as in electronic filters.

However, the integration of passive elements into an integrated circuit creates numerous problems. One problem that arises is that electrical coupling between adjacent circuit elements within the same section can increase the crosstalk and noise within the electrical circuit. Crosstalk and noise may produce unwanted transmissions and results in performance degradation in communication systems utilizing these components. For example, FIG. 1 illustrates an isometric view of an integrated circuit 5 used in the prior art which utilizes an integrated inductive element 10 with a resistance and an integrated capacitive element 12 positioned adjacent to or within a dielectric substrate 7, wherein integrated capacitive element 12 defines a surface. Integrated inductive element 10 has a width 15 that is parallel with the surface of integrated capacitive element 12. Further, integrated inductive element 10 induces a circumferential magnetic field 17 that is perpendicular to both the surface of integrated capacitive element 12 and width 15. Circumferential magnetic field 17 will therefore induce eddy currents which will impede the current flow and increase the resistance of integrated inductive element 10. Circumferential magnetic field 17 will also make the current density across width 15 non-uniform, i.e. in this example, the current density along the inner edge of integrated inductive element 10 is approximately twice the current density along the outer edge. Consequently, the increased resistance of integrated inductive element 10 will degrade the quality factor and performance of the circuit.

Crosstalk also occurs between circuit elements of different circuit sections. One method to decrease the electrical coupling between adjacent circuit sections is to insert an isolation wall. For example, FIG. 2 illustrates a prior art elliptical filter 20 which utilizes two adjacent elliptical filter sections 22 and 24 separated by an isolation wall 26. The primary coupling occurs between the inductive components in adjacent circuit sections. The purpose of isolation wall 26 is to prevent the induced circumferential magnetic field from elliptical filter section 22 from penetrating into elliptical filter section 24, and vice versa. However, the problem with using isolation wall 26 is that the size of the circuit is increased because the elliptical sections must be spaced further apart to accommodate the isolation wall. Thus, an isolation wall has a size that is prohibitive and dramatically increases the cost of the electronic circuit.

It would be highly advantageous, therefore, to remedy the foregoing and other deficiencies inherent in the prior art.

SUMMARY OF THE INVENTION

A method of utilizing passive circuit components in an integrated circuit involves orienting the integrated inductive elements at an angle with the integrated capacitive elements and with the width of the integrated inductive elements so as to minimize the magnitude of the eddy currents induced by the circumferential magnetic field created by the integrated inductive elements. The method also involves orienting adjacent integrated inductive elements so that the circumferential magnetic fields are anti-parallel in between integrated inductive elements and, consequently, cancel to minimize electromagnetic coupling. Minimizing electromagnetic coupling significantly reduces the crosstalk between adjacent inductive elements and improves the quality factor and frequency response of the integrated circuit.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
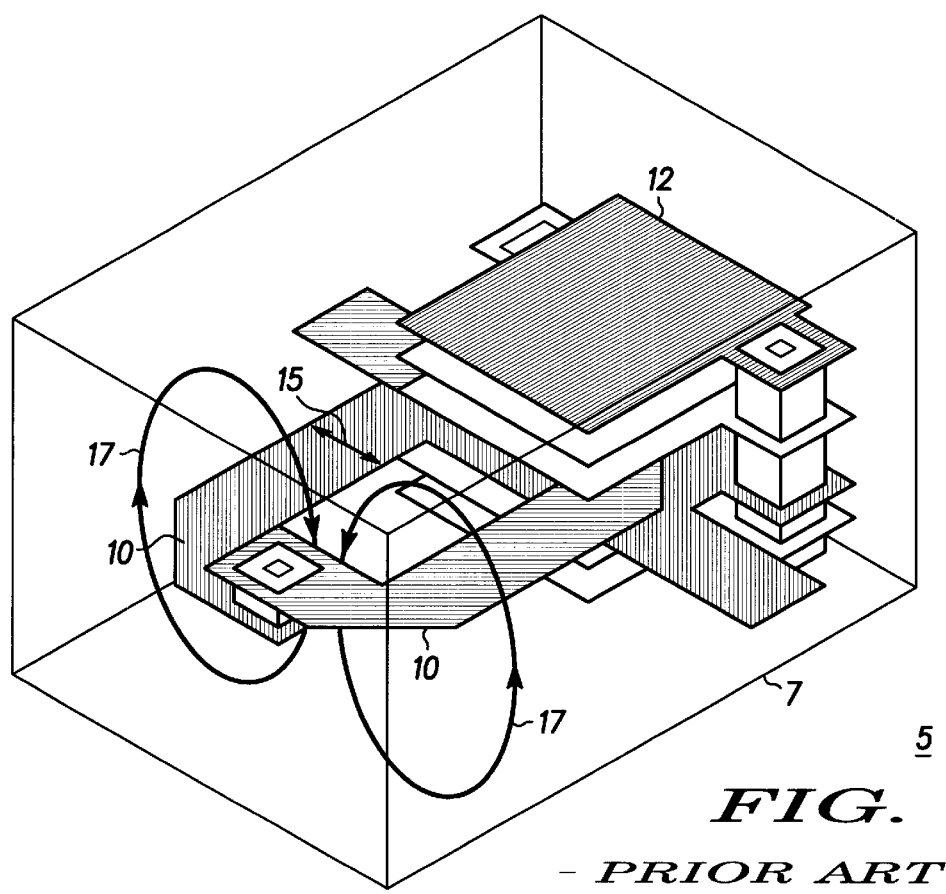
FIG. 1 is an isometric view of a prior art microstrip integrated inductor element interconnected with an integrated capacitor element.
Figure 2:
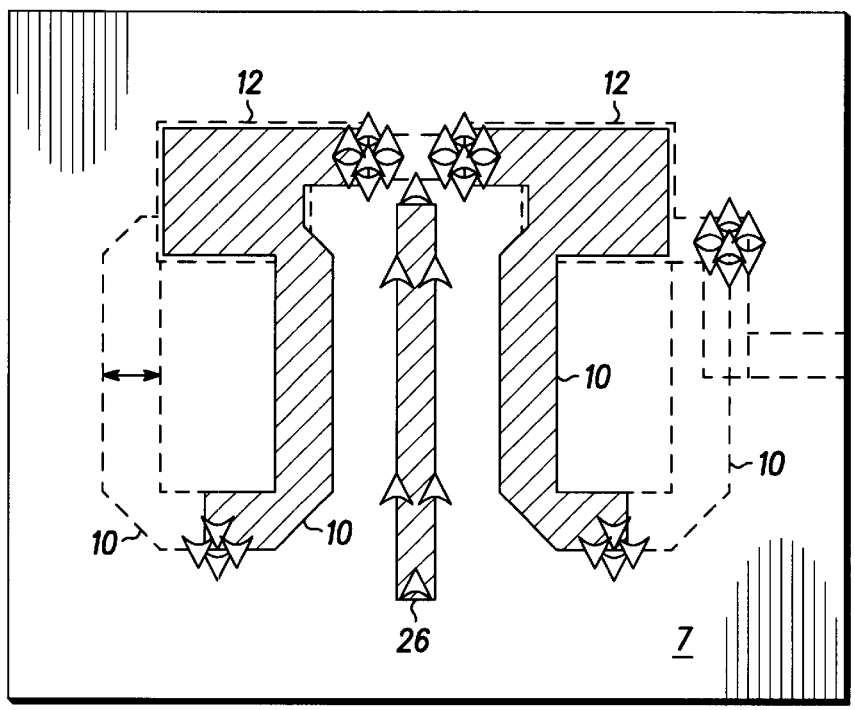
FIG. 2 is a plan view of a prior art elliptical filter which utilizes an isolation wall.
Figure 3:
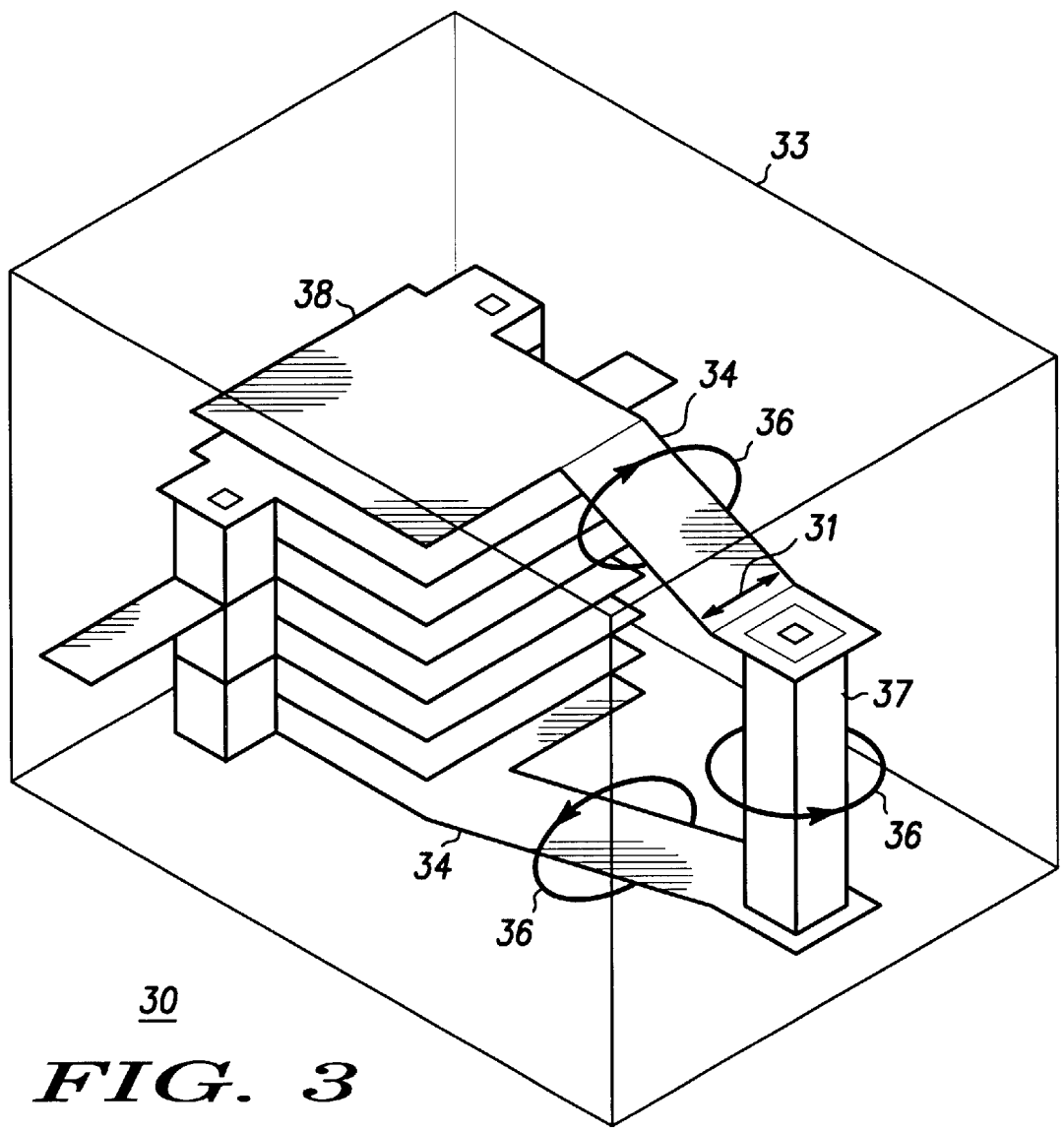
FIG. 3 is an isometric view of an improved microstrip integrated inductor element interconnected with an integrated capacitor element.

Turn now to FIG. 3, which illustrates an isometric view of an improved microstrip integrated circuit apparatus 30 in accordance with the present invention. The main purpose of this illustration is to demonstrate the basic idea behind minimizing the electromagnetic coupling between adjacent circuit elements. Hence, microstrip integrated circuit apparatus 30 will be used to illustrate the method of integrating passive circuit components within an integrated circuit so as to minimize the crosstalk and noise between circuit elements and improve the quality factor and performance.

Microstrip integrated circuit apparatus 30 includes a dielectric substrate 33 onto which an integrated capacitive element 38 is positioned wherein integrated capacitive element 38 defines a surface. It will be understood that dielectric substrate 33 can include any suitable material, such as a low temperature cofired ceramic or a laminated ceramic, and can include multiple layers. By including multiple layers, the metal interconnects can be distributed both on and/or within the dielectric substrate. Metal interconnects positioned within the dielectric substrate minimizes the required area necessary to hold an electronic circuit since now the metal interconnects can be routed in three dimensions.

An integrated inductive element 34 which has a width 31 is also positioned adjacent to or within dielectric substrate 33 and is interconnected with integrated capacitive element 38. Further, integrated inductive element 34 has a resistance and an inductance and creates a circumferential magnetic field 36. In this preferred embodiment, integrated inductive element 34 includes one metal coil and is formed within multiple layers of dielectric substrate 33 with each layer being interconnected by a via 37. However, it will be understood that integrated inductive element 34 can include any number of metal coils and the use of one metal coil in this embodiment is for illustrative purposes only.

In this preferred embodiment, integrated inductive element 34 has been rotated 90° with respect to the plane of integrated capacitive element 38. Hence, circumferential magnetic field 36 is now parallel to the plane of integrated capacitive element 38 and width 31. Consequently, the eddy currents induced by circumferential magnetic field 36 are significantly reduced and the current density along width 31 is more uniform. As a result, the resistance of integrated inductive element 34 is decreased and the quality factor of microstrip integrated circuit apparatus 30 is significantly improved.

Thus, the method of utilizing passive circuit components in an integrated circuit involves orienting the integrated inductive element relative to the integrated capacitive element such that the induced circumferential magnetic field creates a minimal amount of eddy currents in the integrated capacitive element. The reduction of the eddy current results in equal current distribution on the conductor edges thereby minimizing the resistance of the integrated inductive element. Further, it will be understood that the improved method can be used in any integrated circuit that utilizes inductive and capacitive elements.

Figure 4:
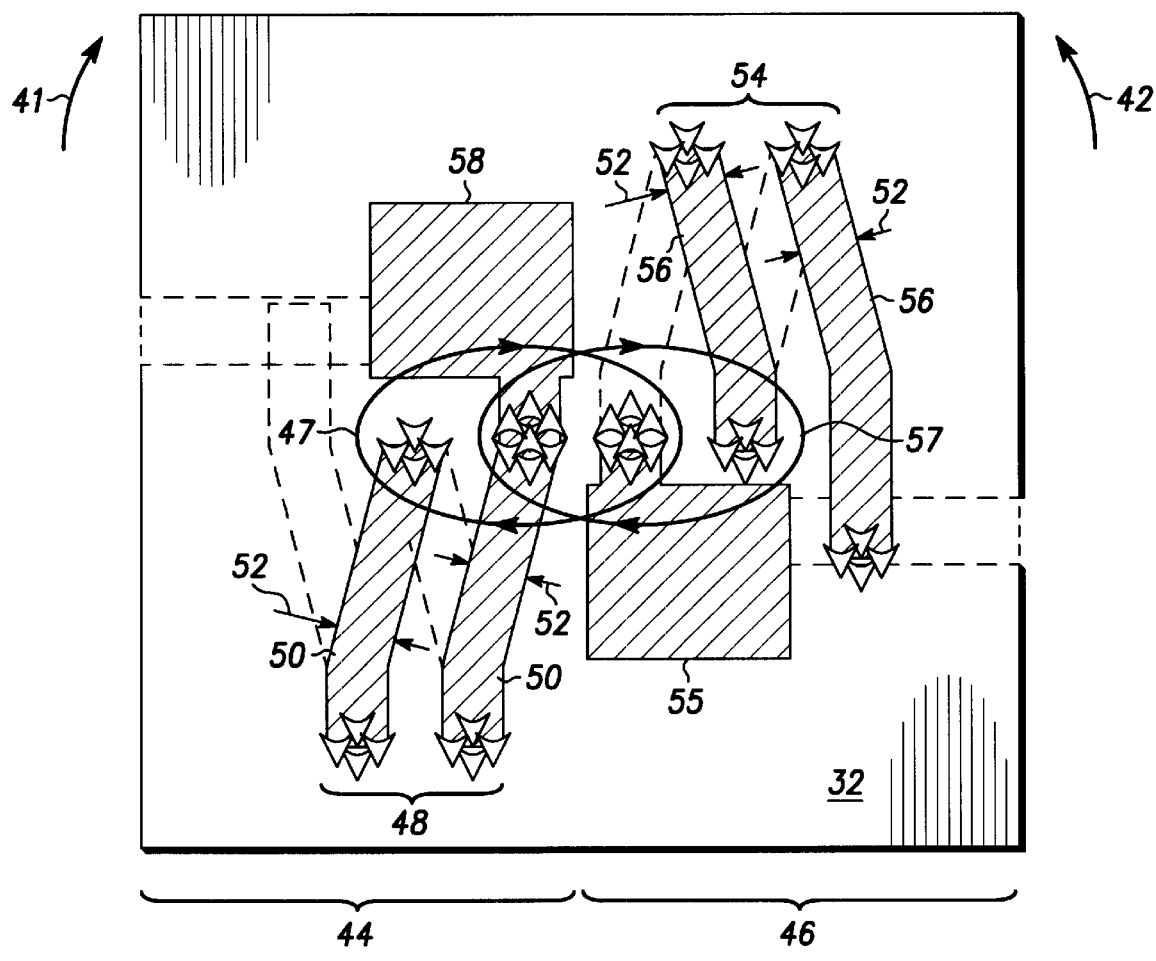
FIG. 4 is a plan view of an elliptical filter section illustrating the coupling between adjacent integrated inductor elements.

Turn now to FIG. 4 which illustrates a plan view of another embodiment of an elliptical filter 40. The main purpose of this illustration is to show the crosstalk that occurs between circuit elements of different circuit sections. In this embodiment, elliptical filter 40 utilizes two adjacent elliptical filter sections 44 and 46. However, it will be understood that elliptical filter 40 can include more than two elliptical filter sections. Also in this embodiment, elliptical filter section 44 includes an integrated inductive element 48 and an integrated capacitive element 58 and elliptical filter section 46 includes an integrated inductive element 54 and an integrated capacitive element 55. Integrated inductive elements 48 and 54 include a metal coil 50 and a metal coil 56, respectively. Also, each metal coil of integrated inductive elements 48 and 54 has a width 52. It will be understood that inductive elements 48 and 54 can include one or more metal coils, but are shown to include two metal coils in this embodiment for illustrative purposes only.

Elliptical filter sections 44 and 46 each have a circumferential magnetic field 47 and 57, respectively. Magnetic fields 47 and 57 are both oriented in a clockwise direction 41. Hence, the circumferential magnetic fields are in phase in the area between elliptical filter sections 44 and 46 and, consequently, elliptical filter sections 44 and 46 are electromagnetically coupled.

Figure 5:
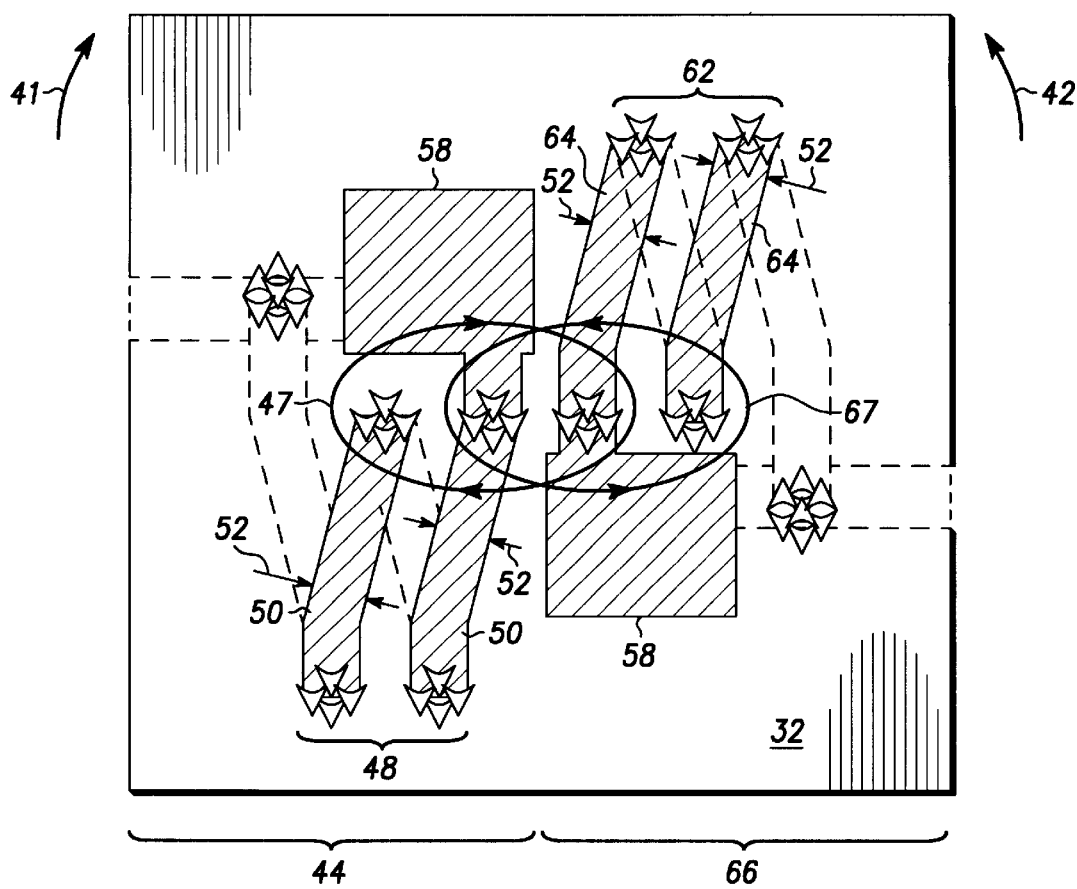
FIG. 5 is a plan view of an improved elliptical filter section illustrating the reduced coupling between adjacent integrated inductor elements.

Turn now to FIG. 5 which illustrates an improved embodiment of an elliptical filter 60. The main purpose of this illustration is to show that the electromagnetic coupling that occurs between circuit elements of different sections can be decreased by orienting the integrated inductive element in elliptical filter section 44 with the integrated inductive element in elliptical filter section 46. The rotation direction of the circumferential magnetic fields can be controlled by changing the orientation of the inductor coils.

For example, in FIG. 5 elliptical filter sections 44 and 46 each have circumferential magnetic fields 47 and 67, respectively, only in this preferred embodiment, the circumferential magnetic field in elliptical section 66 is now oriented in a counter clockwise direction 42 while the circumferential magnetic field in elliptical section 44 is still oriented in clockwise direction 41. The change in rotation direction is accomplished by making elliptical filter section 66 identical to elliptical filter section 44, only rotated by 180°. Hence, the circumferential magnetic fields are antiparallel in the area between elliptical filter sections 44 and 66 and, consequently, the circumferential magnetic fields essentially cancel. Thus, the electromagnetic coupling between elliptical filter sections 44 and 66 is significantly reduced.

It will be understood that although elliptical filter section 44 and 66 are shown to be identical, the circumferential magnetic fields can be made to cancel in the area between the sections by making the inductance of integrated inductive element 48 substantially equal to integrated inductive element 62. It is well known in the art that the inductance of an inductor is determined by the number of metal coils, the width of the metal coils, and the volume of the inductor element.

Figure 6:
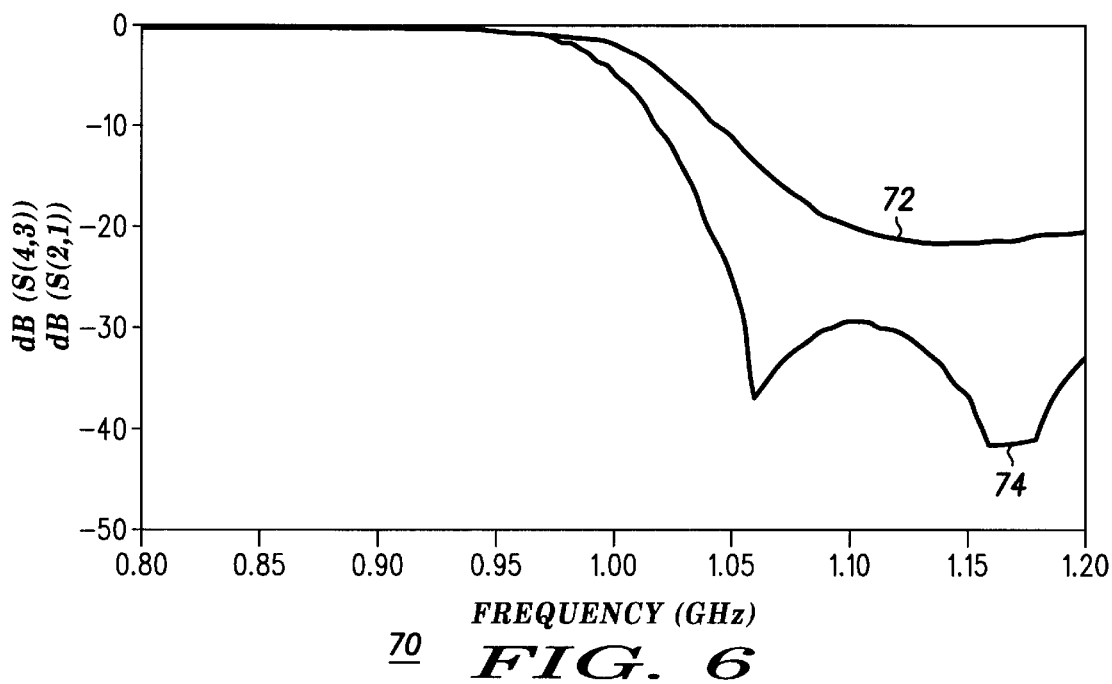
FIG. 6 is a plot illustrating the frequency response of an elliptical lowpass filter.

In this preferred embodiment, elliptical filters are used to illustrate the improved method of utilizing passive circuit components in an integrated circuit. However, this method can also be used in other integrated circuits, such as high pass filters, band pass filter, low pass filters, voltage controlled oscillators, series resonant circuits, parallel resonant circuits, or any other integrated circuit that includes passive inductive elements or passive inductive and capacitive elements. b The reduction in electromagnetic coupling between elliptical filter 40 illustrated in FIG. 4 and improved elliptical filter 60 illustrated in FIG. 5 can be seen in a plot of the frequency response 70 illustrated in FIG. 6. The plot includes a frequency response 72 of elliptical filter 40 and a frequency response 74 of improved elliptical filter 60. As can be seen in FIG. 6, the rejection ratio at high frequency is approximately 10 dB less for improved elliptical filter 60 indicating that the electromagnetic coupling has been significantly reduced.

Thus, integrated inductive and capacitive passive elements can be integrated into an integrated circuit and oriented so as to minimize the crosstalk and noise in the system. Also, the resistance of the integrated inductive element can be reduced so that the quality factor of the integrated circuit is improved. The integration of passive components can be done without using an isolation wall, and, consequently, the size and cost of the integrated circuit can be substantially decreased.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A microstrip integrated circuit apparatus comprising:
   at least one integrated capacitive element, each integrated capacitive element defining a surface;
   at least one integrated inductive element with a width and a volume interconnected with the each integrated capacitive element to form a plurality of integrated circuit sections, wherein each of the integrated inductive elements has a resistance and an inductance, induces a circumferential magnetic field, and is oriented at an angle with adjacent integrated inductive elements such that the coupling of the circumferential magnetic fields is decreased, and the circumferential magnetic fields are parallel to the width and parallel to the plane in each of the plurality of integrated capacitive elements, and minimized between adjacent integrated circuit sections.

2. A microstrip integrated circuit as claimed in claim 1 wherein the microstrip integrated circuit is formed on or within a laminated ceramic substrate.

3. A microstrip integrated circuit as claimed in claim 1 wherein the volume of the integrated inductive element is adjusted to adjust the inductance.

4. A microstrip integrated circuit as claimed in claim 1 wherein each integrated inductive element is oriented at an angle with the adjacent integrated inductive element such that the magnetic fields are in phase external to the integrated inductive element and out of phase internal to the integrated inductive element coils.

5. A microstrip resonant circuit apparatus comprising:
a dielectric substrate;
a multilayer capacitive element positioned on or within the dielectric substrate, wherein the multilayer capacitive element defines a surface; and
a multilayer inductive element with a width and a volume positioned adjacent or within the dielectric substrate wherein multilayer inductive element has an inductance and a resistance, and wherein the multilayer inductive element induces a circumferential magnetic field and is interconnected with the multilayer capacitive element to form a resonant circuit including one of a series resonant circuit and a parallel resonant circuit, and wherein the multilayer inductive element is oriented such that the circumferential magnetic field is parallel to the width and to the plane of at least one multilayer capacitive element.

6. A microstrip resonant circuit apparatus as claimed in claim 5 wherein the dielectric substrate includes a laminated ceramic substrate.

7. A microstrip resonant circuit apparatus as claimed in claim 5 including in addition a plurality of resonant circuits positioned adjacent to each other and interconnected, wherein each resonant circuit is oriented at an angle with adjacent resonant circuits such that the coupling of the circumferential magnetic fields is decreased.

8. A method of adjusting the quality factor of a microstrip resonant circuit comprising the steps of:
providing a dielectric substrate;
forming a plurality of resonant circuits positioned adjacent to each other and interconnected, wherein each resonant circuit includes a quality factor including at least one inductive element with a width and at least one capacitive element which defines a surface, each of the plurality of resonant circuits is positioned on or within the dielectric substrate, wherein each inductive element creates a circumferential magnetic field, and wherein each resonant circuit is oriented at an angle with adjacent resonant circuits such that the coupling of the circumferential magnetic field is decreased, and such that the magnetic fields are minimized between adjacent resonant circuits; and
orienting the inductive element such that the circumferential magnetic field is parallel to the width and to the surface of the capacitive element.

9. A method of adjusting the quality factor of a microstrip resonant circuit as claimed in claim 8 wherein the dielectric substrate includes a laminated ceramic substrate.

* * * * *